(12) United States Patent
Mazhari et al.

(10) Patent No.: US 9,831,453 B2
(45) Date of Patent: Nov. 28, 2017

(54) FOUR-TERMINAL GATE-CONTROLLED THIN-FILM ORGANIC THYRISTOR

(71) Applicant: Indian Institute of Technology Kanpur, Kanpur, Uttar Pradesh (IN)

(72) Inventors: Baquer Mazhari, Kanpur (IN); Arjit Ashok, Kanpur (IN)

(73) Assignee: INDIAN INSTITUTE OF TECHNOLOGY KANPUR, Kanpur, Uttar Pradesh (IN)

( * ) Notice: Subject to any disclaimer, the term of this patent is extended or adjusted under 35 U.S.C. 154(b) by 0 days.

(21) Appl. No.: 15/026,705

(22) PCT Filed: Dec. 28, 2013

(86) PCT No.: PCT/IB2013/061383
§ 371 (c)(1),
(2) Date: Apr. 1, 2016

(87) PCT Pub. No.: WO2015/063550
PCT Pub. Date: May 7, 2015

(65) Prior Publication Data
US 2016/0254469 A1  Sep. 1, 2016

(30) Foreign Application Priority Data
Oct. 31, 2013  (IN) .......................... 3218/DEL/2013

(51) Int. Cl.
*H01L 51/05* (2006.01)
*H01L 29/66* (2006.01)
(Continued)

(52) U.S. Cl.
CPC .... *H01L 51/0562* (2013.01); *H01L 29/66007* (2013.01); *H01L 29/739* (2013.01); *H01L 51/0545* (2013.01); *H01L 51/105* (2013.01)

(58) Field of Classification Search
CPC .......... H01L 51/0562; H01L 29/66007; H01L 29/739; H01L 51/0545; H01L 51/105
See application file for complete search history.

(56) References Cited

U.S. PATENT DOCUMENTS

| | | |
|---|---|---|
| 4,176,371 A | 11/1979 | Schlegel |
| 5,710,445 A | 1/1998 | Bauer et al. |
| | (Continued) | |

FOREIGN PATENT DOCUMENTS

| | | | | |
|---|---|---|---|---|
| IT | WO 2011110664 A1 | * | 9/2011 | ......... H01L 51/0562 |
| JP | 2009049204 A | * | 3/2009 | ......... H01L 51/0541 |

OTHER PUBLICATIONS

Bonfiglio, A., et al., "A completely flexible organic transistor obtained by a one-mask photolithographic process," Applied Physics Letters, vol. 82, No. 20, pp. 3550-3552 (May 19, 2003).
(Continued)

*Primary Examiner* — Peter Bradford
(74) *Attorney, Agent, or Firm* — Turk IP Law, LLC

(57) ABSTRACT

Technologies are generally described for a four-terminal, gate-controlled, thin-film thyristor device. The thyristor device may essentially be an n-type thin-film transistor (TFT) with an additional emitter terminal. The thyristor device may exhibit an S-shaped negative differential resistance (NDR) characteristic resulting from conductance modulation. The conductance modulation may be caused by formation of a secondary channel for current flow due to an inherent structure of the device. The secondary channel may be formed in a semiconductor area within the device, the semiconductor area including a hole transporting organic semiconductor layer (HTL) and an electron transporting organic semiconductor layer (ETL). A gate terminal of the
(Continued)

thyristor device may further allow onset of NDR characteristics to be controlled and may allow the device to be switched off.

27 Claims, 7 Drawing Sheets

(51) Int. Cl.
*H01L 29/739* (2006.01)
*H01L 51/10* (2006.01)

(56) References Cited

U.S. PATENT DOCUMENTS

| | | | |
|---|---|---|---|
| 6,087,193 | A | 7/2000 | Gray |
| 6,512,274 | B1 | 1/2003 | King et al. |
| 6,648,711 | B1 | 11/2003 | Jang et al. |
| 6,933,541 | B1 | 8/2005 | Huang |
| 7,385,230 | B1 | 6/2008 | Taylor |
| 2003/0085397 | A1* | 5/2003 | Geens ............... B82Y 10/00 257/40 |
| 2009/0101891 | A1* | 4/2009 | Moon ............... B82Y 10/00 257/40 |
| 2010/0019231 | A1 | 1/2010 | Smith et al. |
| 2010/0051913 | A1* | 3/2010 | Takeya ............... H01L 51/052 257/40 |
| 2011/0215306 | A1* | 9/2011 | Kato ............... B82Y 10/00 257/40 |
| 2011/0215314 | A1* | 9/2011 | De Leeuw ......... H01L 51/0554 257/40 |
| 2012/0175602 | A1* | 7/2012 | Hwang ............... B82Y 10/00 257/40 |
| 2015/0008420 | A1* | 1/2015 | Mazhari ............. H01L 51/0562 257/40 |
| 2015/0129034 | A1* | 5/2015 | Snaith ............... H01L 51/4213 136/258 |
| 2015/0270503 | A1* | 9/2015 | Luessem ............. H01L 51/002 257/40 |

OTHER PUBLICATIONS

Chen, J., et al., "Negative differential resistance and multilevel memory effects in organic devices," Semiconductor Science and Technology, vol. 21, pp. 1121-1124 (2006).

Guo, W., et al., "Room temperature negative differential resistance based on a single ZnO nanowire/CuPc nanofilm hybrid heterojunction," Applied Physics Letters, vol. 97, Issue 26, pp. 263118-1-263118-3 (Dec. 30, 2010).

International Search Report and Written Opinion for International Application No. PCT/IB2013/061383, mailed on May 7, 2014.

Kannan, V., et al., "Observation of room temperature negative differential resistance in multi-layer heterostructures of quantum dots and conducting polymers," Nanotechnology, vol. 22, No. 2, pp. 025705-1-025705-5 (Jan. 14, 2011).

Kim, S. J. and Lee, J. S., "Flexible Organic Transistor Memory Devices," Nano Lett., vol. 10, No. 8, pp. 2884-2890 (Jun. 25, 2010).

Lesk, I. A., et al., "The Double-Base Diode—A New Semiconductor Device," IRE Convention Record, Part 6, pp. 2-8 (1953).

Nanditha, D. M., et al., "Operation of a reversed pentacene-fullerene discrete heterojunction photovoltaic device," Applied Physics Letters, vol. 90, pp. 113505-1-113505-3 (2007).

Rost, C., et al., "Ambipolar organic field-effect transistor based on an organic heterostructure," Journal of Applied Physics, vol. 95, pp. 5782-5797 (2004).

Sawano, F., et al., "An organic thyristor," Nature, vol. 437, pp. 522-524 (Sep. 22, 2005).

Suran, J. J., "Low-Frequency Circuit Theory of the Double-Base Diode," IRE Transactions on Electron Devices, vol. 2, Issue 2, pp. 40-48 (Apr. 1955).

Tseng, R. J., et al., "Nanoparticle-induced negative differential resistance and memory effect in polymer bistable light-omitting device," Applied Physics Letters, vol. 88, pp. 123506-1-123506-3 (Mar. 21, 2006).

Xie, et al., "Negative differential resistance based on electron injection/extraction in conducting organic films," Applied Physics Letters, vol. 95, pp. 063301-1-063301-3 (Aug. 10, 2009).

Xu, X. H., et al., "Organic negative-resistance devices using PPV containing electron-transporting groups on the main chain," Journal of Polymer Science, Part B: Polymer Physics, vol. 39, Issue 5, pp. 589-593 (Mar. 1, 2001).

Yang, Y., et al., "Electrical Switching and Bistability in Organic/Polymeric Thin Films and Memory Devices," Advanced Functional Materials, vol. 16, Issue 18, pp. 1001-1014 (May 2006).

You, Y. T., et al., "Conductance-dependent negative differential resistance in organic memory devices," Applied Physics Letters, vol. 97, p. 233301 (2010).

Zhou, W., et al., "Photothermal deflection spectra of solid C60," J. Phys.: Condens. Matter, vol. 8, pp. 5793-5800 (1996).

\* cited by examiner

FOUR-TERMINAL GATE-CONTROLLED THIN-FILM ORGANIC THYRISTOR

CROSS-REFERENCE TO RELATED APPLICATIONS

This Application is the U.S. National State filing under 35 U.S.C. §371 of International Application No. PCT/IB2013/061383, filed on Dec. 28, 2013, which claims priority under 35 U.S.C. §§119(a) and 119(b) of India Patent Application No. 3218/DEL/2013, filed on Oct. 31, 2013. The disclosures of International Application No. PCT/IB2013/061383 and India Patent Application No. 3218/DEL/2013 are herein incorporated by reference in their entireties.

BACKGROUND

Unless otherwise indicated herein, the materials described in this section are not prior art to the claims in this application and are not admitted to be prior art by inclusion in this section.

Negative differential resistance (NDR) is a property of electrical circuit elements in which, over certain voltage ranges, current may be a decreasing function of voltage. NDR may be classified into broad categories of N- and S-shaped current-voltage characteristics. PN junction tunnel diodes and resonant tunneling diodes are among examples of devices that may exhibit N-shaped NDR. Thyristors are semiconducting devices that may exhibit S-type NDR. Thyristor devices may include a four layer diode of alternating n-type and p-type material and three terminals. Devices that exhibit NDR may be useful in memory and switching applications. Devices that exhibit S-type NDR may be particularly useful in applications such as inverters and motor control due to their utility to control AC current.

The use of organic semiconducting materials may be attractive because of the potential for fabrication of circuits on flexible substrates using low cost printing techniques. Organic thin-film transistors, solar cells, and light emitting diodes have improved in performance and achieved commercial success over the last decade.

SUMMARY

The present disclosure is generally directed to four-terminal, gate-controlled, thin-film organic semiconductor devices and methods of fabricating such devices.

According to some examples, a semiconductor device is described. An example semiconductor device may include a two-layer semiconductor area comprising a hole transport layer (HTL) and an adjoining electron transport layer (ETL), a source terminal configured to contact the HTL and the ETL at respective first end portions, a drain terminal configured to contact the HTL and the ETL at respective second end portions, the second end portions being opposite to the first end portions, and an emitter terminal configured to contact the HTL. The semiconductor device may further include a dielectric layer configured to contact the source terminal, the drain terminal, and the ETL, and a gate terminal configured to contact the dielectric layer, where the semiconductor device is configured to exhibit negative differential resistance (NDR) characteristics.

According to other examples, methods to fabricate a semiconductor device are described. An example method may include forming a two-layer semiconductor area comprising a hole transport layer (HTL) and an adjoining electron transport layer (ETL); forming a source terminal to contact the HTL and the ETL at respective first end portions; forming a drain terminal to contact the HTL and the ETL at respective second end portions, the second end portions being opposite to the first end portions; and forming a dielectric layer to contact the source terminal, the drain terminal, and the ETL. The method may further include forming a gate terminal to contact the dielectric layer and forming an emitter terminal to contact the HTL, where the semiconductor device is configured to exhibit negative differential resistance (NDR) characteristics.

According to further examples, methods to operate a semiconductor device are described. An example method may include applying one or more of a gate voltage and a drain voltage to the semiconductor device. The semiconductor device may include a two-layer semiconductor area comprising a hole transport layer (HTL) and an adjoining electron transport layer (ETL); a source terminal configured to contact the HTL and the ETL at respective first end portions; and a drain terminal configured to contact the HTL and the ETL at respective second end portions, the second end portions being opposite to the first end portions. The semiconductor device may also include an emitter terminal configured to contact the HTL; a dielectric layer configured to contact the source terminal, the drain terminal, and the ETL; and a gate terminal configured to contact a dielectric layer. The example method may also include in response to applying the one or more of the gate voltage and the drain voltage, exhibiting, by the semiconductor device, negative differential resistance (NDR) characteristics.

According to yet other examples, a thyristor is described. An example thyristor may include a two-layer semiconductor area comprising a hole transport layer (HTL) and an adjacent electron transport layer (ETL); a source terminal coupled to the HTL and the ETL at respective first end portions; a drain terminal coupled to the HTL and the ETL at respective second end portions, the second end portions being opposite to the first end portions; an emitter terminal coupled to the HTL; a dielectric layer coupled to the source terminal, the drain terminal, and the ETL; and a gate terminal coupled to a dielectric layer, where the thyristor is configured to exhibit negative differential resistance (NDR) characteristics controlled by one or more of the gate and the drain terminals.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
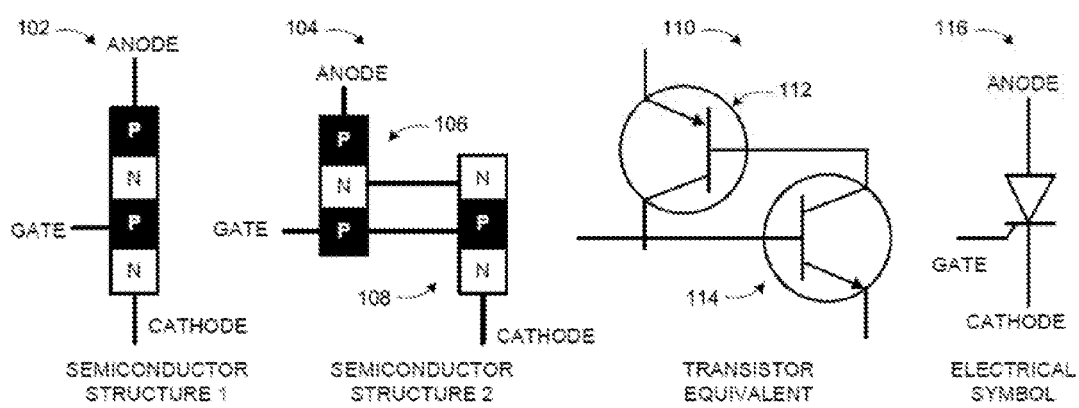
FIG. 1 illustrates an example structure on physical and electronic levels, an equivalent circuit diagram, and a symbol of an example thyristor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to apparatus, devices, and/or methods related to a four-terminal, gate-controlled, thin-film thyristor device.

Briefly stated, technologies are generally described for a four-terminal, gate-controlled, thin-film semiconductor device. An example semiconductor device (e.g., a thyristor) may be an n-type thin-film transistor (TFT) and include an additional emitter terminal. The thyristor device may exhibit an S-shaped negative differential resistance (NDR) characteristic resulting from conductance modulation. The conductance modulation may be caused by formation of a secondary channel for current flow due to an inherent structure of the device. The secondary channel may be formed in a semiconductor area within the device, the semiconductor area including a hole transporting organic semiconductor layer (HTL) and an electron transporting organic semiconductor layer (ETL). A gate terminal of the thyristor device may further allow onset of NDR characteristics to be controlled and may allow the device to be switched off.

FIG. 1 illustrates an example structure on physical and electronic levels, an equivalent circuit diagram, and a symbol of an example thyristor, arranged in accordance with at least some embodiments described herein.

As shown in a diagram 100, two structures, a basic structure 102 and a dual-device structure 104, may be used to illustrate the example thyristor device. The dual device structure 104 may further include a first structure 106 and a second structure 108. The equivalent circuit diagram 110, including a first structure 112 and a second structure 114, and an electrical symbol 116 may also be representative of the example thyristor device.

The basic structure 102 may include four-layers of alternating p- and n-type materials (p-n-p-n) arranged unilaterally, analogously termed a four-layer diode. The basic structure may also include two main terminals across the four-layer diode (one cathode and one anode), and an additional gate terminal attached to the p-type material nearest to the cathode. The dual device structure 104 may include the first structure 106 with three-layers of alternating positive and negative-type material (p-n-p) arranged unilaterally, an anode terminal, and a gate terminal attached to the p-type material furthest from the anode. The first structure 106 may be electrically coupled to the second structure 108, which may include three-layers of alternating positive and negative-type material (n-p-n) and a cathode terminal. The structures may couple from an n-type material in the first structure 106 to an n-type material in the second structure 108 and/or from a p-type material in the first structure 106 to an n-type material in the second structure 108.

The equivalent circuit diagram 110 may include a first structure 112 with layers of positive and negative-type materials arranged unilaterally, an anode terminal, and a gate terminal. The first structure 112 may be electrically coupled to the second structure 114, which may include layers of alternating positive and negative-type material arranged unilaterally and a cathode terminal. The electrical symbol further illustrates the structure of the example thyristor 116, including a four-layer diode represented by the triangle, two main terminals (an anode and a cathode), and a gate terminal attaching to a p-type layer of the diode nearest to the cathode. The above-described conventional semiconductor devices are distinguished from example embodiments described below.

Inorganic semiconductor based thyristors may be implemented as a two-terminal, four-layer p-n-p-n structure. The addition of a third gate terminal may result in gate-turnoff thyristors (GTO). Organic semiconducting materials may be attractive because of the potential for fabrication of circuits on flexible substrates using low cost printing techniques. Examples of organic devices that may show N-shaped NDR characteristics may include multi-layer heterostructures of quantum dots and conducting polymers, zinc-oxide (ZnO) nanowire/copper-phthalocyanine (CuPc) nanofilm hybrid heterojunction devices, polymers with embedded nanoparticles, conducting polymer films, films of Pentacene and CuPc semiconductors, and similar ones. Current organic devices exhibiting S-shaped NDR characteristics may include thyristors that utilize properties of metal nanoparticles or a specific organic molecule to exhibit NDR.

Alternately, a basic structure 102 thyristor using an organic semiconductor as proposed in the present disclosure may exhibit S-shaped NDR characteristics achieved through structural changes to a thin film transistor (TFT). The structural changes may include addition of a fourth terminal, an emitter terminal, and use of heterostructures. Furthermore, a gate terminal of the proposed device may allow the onset of NDR to be electrically controlled. The device may be switched off independently through the gate terminal.

Figure 2:
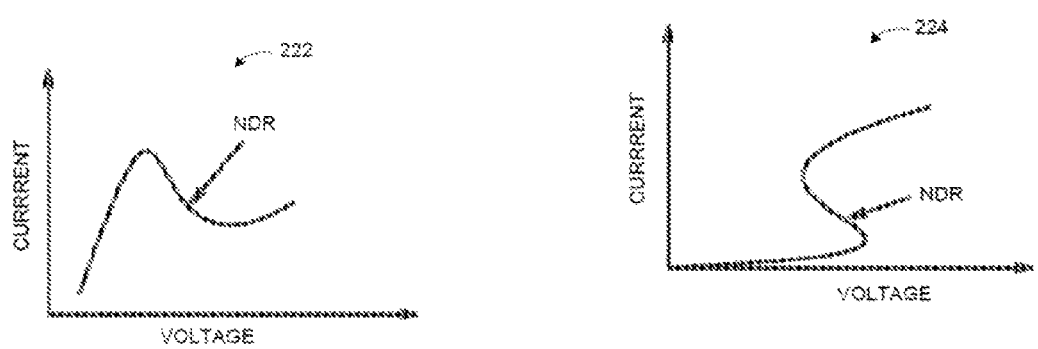
FIG. 2 illustrates example negative differential resistance curves of a device with N-shaped NDR and a device with S-shaped NDR.

FIG. 2 illustrates example negative differential resistance curves of a device with N-shaped NDR and a device with S-shaped NDR, arranged in accordance with at least some embodiments described herein.

As shown in a diagram 200, a device with an N-shaped NDR may exhibit a voltage-current curve 222 and a device with an S-shaped NDR may exhibit a voltage-current curve 224.

Negative differential resistance (NDR) may imply that current decreases with an increase in voltage or alternatively current increases with a decrease in voltage. NDR devices may be classified into broad categories of N and S-shaped current-voltage characteristics.

A thyristor device may exhibit three states, including a reverse blocking state, a forward blocking state, and a forward conducting state. In the reverse blocking state, voltage may be applied such that a diode would not permit a current flow. In the forward blocking state, voltage may be applied such that a diode may permit a current flow, but the thyristor may have not yet been triggered into conduction. In the forward conducting state, the thyristor may be triggered into conduction and may remain conducting until the forward current decreases below a threshold value, termed the holding current. As a result of these states, thyristor devices exhibiting S-shaped NDR 224 may be in low current, blocking states initially but once the applied voltage crosses a threshold value, the device may switch into a conducting state and remain there until the current is reduced to zero.

Figure 3:
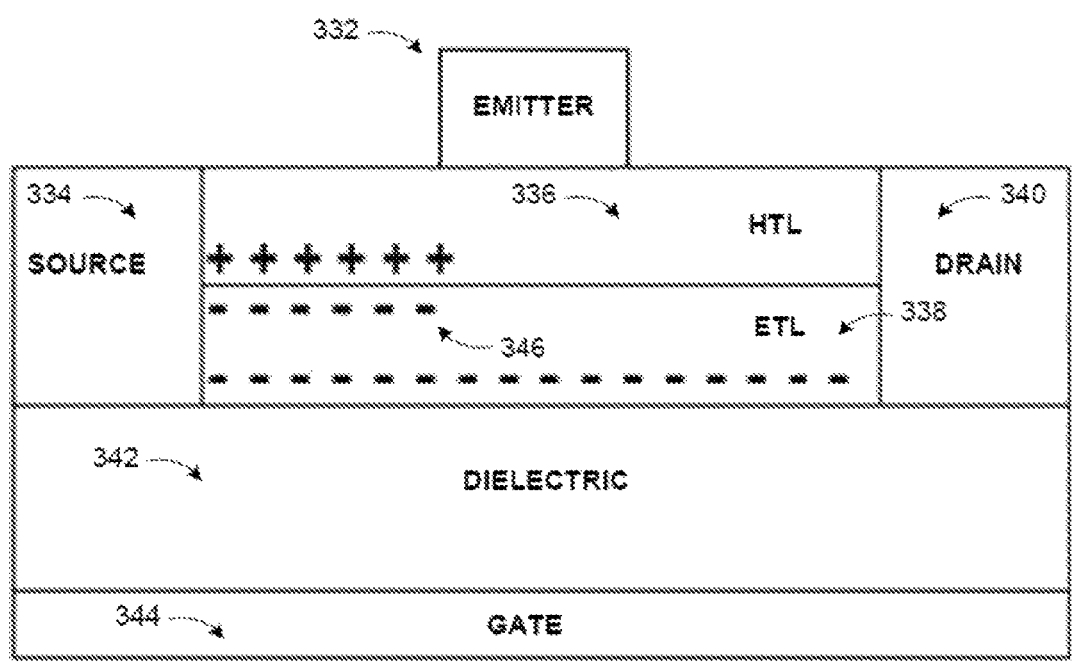
FIG. 3 illustrates an example physical structure of an example four-terminal thyristor device.

FIG. 3 illustrates an example physical structure of an example four-terminal thyristor device, arranged in accordance with at least some embodiments described herein.

As shown in a diagram 300, the physical structure of an example four-terminal thyristor device may include an emitter terminal 332, a source terminal 334, a hole transporting organic semiconductor layer (HTL) 336, an electron transporting organic semiconductor layer (ETL) 338, a drain terminal 340, a dielectric layer 342, and a gate terminal 344.

The four-terminal thyristor device may be comprised of a thin-film transistor (TFT) with an additional emitter terminal 332, which may be in contact with the HTL 336. The semiconductor area in the TFT may include two layers, the HTL 336 and the ETL 338. The ETL 338 may be below the HTL 336. The HTL and the ETL may each range from about 10 nm to about 100 nm thick, for example, and the interface between the HTL and ETL may be selected based on a desired current for the semiconductor device. Large energy barriers may be introduced structurally at the interface of the HTL and ETL to block the flow of holes from HTL to ETL and the flow of electrons from the ETL to HTL.

In some examples, the composition and the thickness of the HTL and the ETL may also be selected such that holes in the HTL may attract electrons in the ETL to a second interface between the HTL and the ETL and create a secondary channel comprising electrons in ETL. The composition and the thickness of the HTL and the ETL may be further selected such that two current paths may be formed in the ETL between the emitter and the source terminals resulting in an increase of conductance between the emitter and the source terminals. In some embodiments, the HTL 336 may be formed using Pentacene, Poly-3-hexylthiophene (P3HT), Poly-2-methoxy-5-(2-ethylhexoxy)-1,4-phenylene vinylene (MEH-PPV), copper phthalocyanine, and similar ones. The ETL 338 may be formed using Fullerene ($C_{60}$), [6,6]-phenyl-C61 butyric acid methyl ester (PCBM), N,N'-bis(n-octy)-dicyanoperylene-3,4,9,10-bis (dicarboximide) (PDI-8CN$_2$), and/or others.

The source terminal 334 may contact the HTL 336 and the ETL 338 at one end while the drain terminal 340 may contact the HTL 336 and the ETL 338 at an opposite end. The dielectric layer 342 may be in contact with the source terminal 334, the drain terminal 340, and the ETL 338. The gate terminal 344 may contact the dielectric layer 342. Together the source terminal 334, drain terminal 340, and gate terminal 344 may form an n-type TFT with the ETL 338 and dielectric 342. Upon application of a positive voltage to the gate terminal 344, an accumulation layer of electrons forms at a first interface, the ETL 338 and dielectric layer 342 interface.

When a positive voltage is applied to the drain terminal 340 with respect to the source terminal 334, a current may flow through a primary n-channel in the ETL 338. The positive drain voltage may be in a range of 0 volts to 40 volts, for example. The primary n-channel may act as a potentiometer resulting in a positive potential below the emitter terminal 332. Consequently, the emitter terminal 332 may become reverse biased, as long as the voltage applied at the emitter terminal is less than the channel voltage under the emitter terminal, thus creating a cut-off region where the emitter terminal current may be negligible. When the applied voltage at the emitter terminal 332 is large enough to forward bias the emitter terminal 332, holes may be injected into the HTL 336 and may accumulate at the second interface, the interface of the HTL 336 and ETL 338. The work function of the emitter terminal 332 may be selected such that the emitter can inject holes, not electrons, into the HTL 336. These holes may attract electrons to the second interface creating a secondary channel 346 composed of electrons in the ETL 338 near the second interface. As a result, there may be two current paths in the ETL region between the emitter terminal 332 and source terminal 334 creating an increase in the overall conductance of the ETL region.

Alternately, in the ETL region between the emitter terminal 332 and the drain terminal 340, the conductance may remain substantially the same. This may lead to a redistribution of applied drain terminal voltage, with a larger potential drop in the region between the emitter and the drain terminals. In response, the potential below the emitter terminal 332 may decrease making the emitter terminal junction more forward biased resulting in a regenerative action. Such regenerative action may give rise to a negative differential resistance (NDR) characteristic in the emitter terminal's current-voltage characteristics.

The origin of NDR is at least partially due to conductance modulation in a part of a semiconductor may be similar to conductivity modulation in a unijunction transistor (UJT). However, unlike the UJT, a TFT structure may be employed and conductance modulation may be achieved through creation of the secondary channel of current. Furthermore, a UJT with p and n-type doping may be difficult to implement in an organic semiconductor due to the complexity of doping. A thyristor according to some embodiments may also offer the advantage that the gate terminal 344 may allow convenient switching-off of the device and may also alter the voltage at which NDR characteristics appear. The positive gate voltage may range from about 0 volts to about 40 volts, for example, depending on a choice of material, thickness of material, dimensions of the device, and/or other factors.

Figure 4:
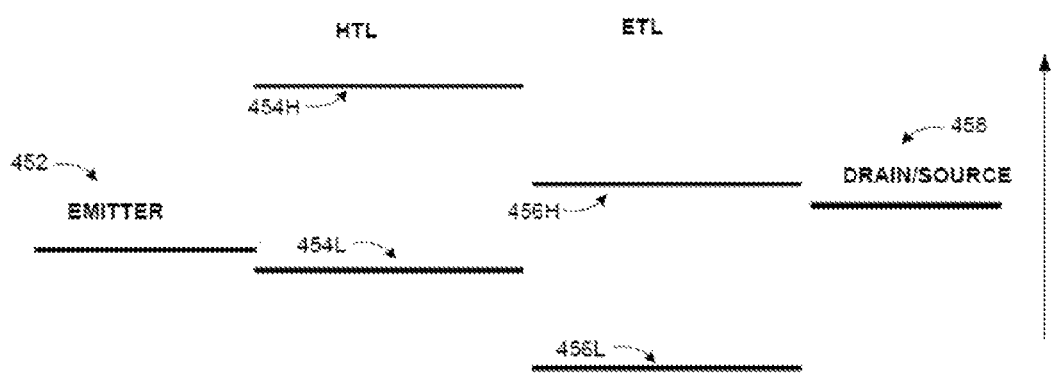
FIG. 4 illustrates an example energy level diagram of an example four-terminal thyristor device.

FIG. 4 illustrates an example energy level diagram of an example four-terminal thyristor device, arranged in accordance with at least some embodiments described herein.

The relative energy levels of specific components of the example four-terminal thyristor device described in FIG. 3 are shown in the diagram 400. The energy levels depicted may include energy levels of an emitter terminal 452, high energy level 454H and low energy level 454L (lowest unoccupied molecular orbital energy "LUMO" for high energy level and highest occupied molecular orbital energy level "HOMO" for low energy level) of a hole transporting organic semiconductor layer (HTL), high and low energy levels (456H and 456L, respectively) of an electron transporting organic semiconductor layer (ETL), and energy levels of a drain/source terminal 458, during operation of the device.

The work function of the emitter terminal 452 may be close to a lower potential energy state of the HTL (low energy level 454L). The HTL and ETL may have two states of potential energy each (454H, 454L, 456H, and 456L), which may be selected so that flow of holes from HTL to ETL is blocked and flow of electrons from ETL to HTL is blocked as well.

When a positive voltage is applied to the drain terminal with respect to the source terminal, a current may flow through a primary n-channel in the ETL, resulting in a positive potential below the emitter terminal.

In the ETL region between the emitter terminal and the drain terminal, the applied drain terminal voltage may be redistributed, with a higher potential drop than in the region between the emitter and the drain terminals. In response, the potential below the emitter terminal may decrease making the emitter terminal junction more forward biased resulting in a regenerative action. Regenerative action may then give rise to a negative differential resistance (NDR) characteristic in the emitter terminal's current-voltage characteristics.

Figure 5:
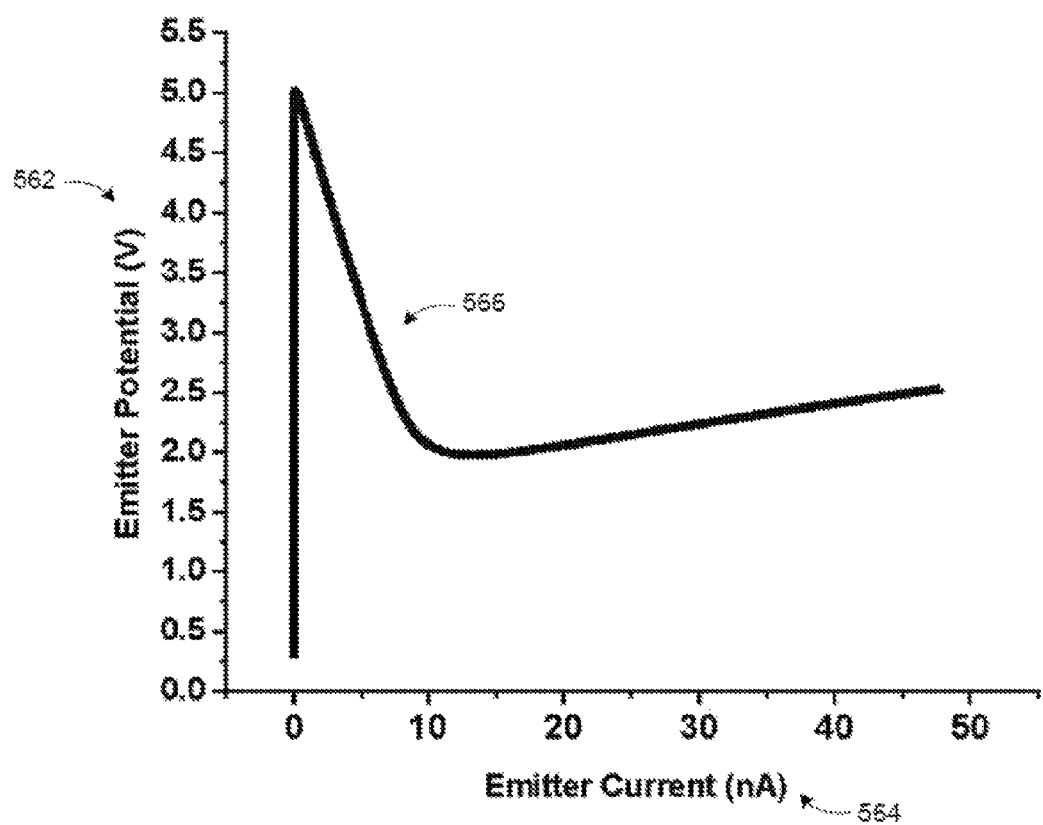
FIG. 5 illustrates an example emitter current-voltage characteristic of an example four-terminal thyristor device for constant drain-source and gate-source bias voltages.

FIG. 5 illustrates an example emitter current-voltage characteristic of an example four-terminal thyristor device for constant drain-source and gate-source bias voltages, arranged in accordance with at least some embodiments described herein.

As shown in a diagram 500, the x-axis represents emitter current 564 (nA) and the y-axis represents emitter potential 562 (V). A curve 566 may then exhibit emitter current-voltage characteristics.

The illustrated emitter current-voltage characteristic curve 566 may be obtained by simulation of a thyristor device based upon the structure in FIG. 3 with a substantially constant drain voltage of 40 V and a substantially constant gate voltage of 30 V. Specifically, the device may include a metal gate terminal with a work function of 5.1 eV and a 100 nm thick dielectric layer with a dielectric constant of 3.9. The dielectric layer may be a polymer such as Polyvinylphenol (PVP) or silicon dioxide and/or other material. The source and drain terminals may be composed of Aluminum (4.2 eV), each 100 µm long with a spacing between the terminals of 300 µm, for example. The emitter terminal may be composed of Gold (5.2 eV) and placed at the center of the device. The length of emitter in the simulation may be 100 µm. Both HTL and ETL in semiconductor area may be 300 µm long, for example. The energy levels may be representative of a system where HTL is Pentacene and ETL is $C_{60}$. Mobility of the holes and/or electrons may vary widely with deposition conditions and a wide range may be selected with the constraint that the upper limit is equal or below experimentally reported values.

The example values described above are in conjunction with an example illustration. A thyristor according to embodiments may be implemented and used with other materials, dimensions, and voltage and/or other electrical values based on the features described herein.

Figure 6:
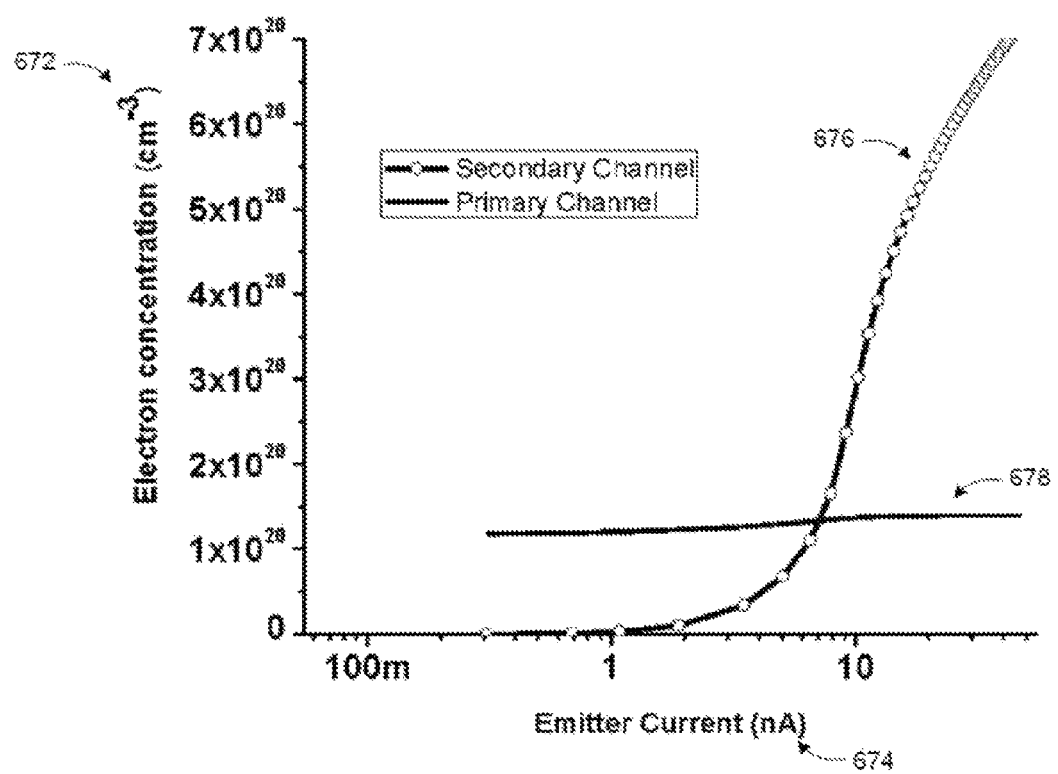
FIG. 6 illustrates an example electron concentration in the primary channel (dielectric/ETL interface) and the secondary channel (ETL/HTL interface) of an example four-terminal thyristor device as a function of emitter current.

FIG. 6 illustrates example electron concentrations in the primary channel (dielectric/ETL interface) and the secondary channel (ETL/HTL interface) of an example four-terminal thyristor device as a function of emitter current, arranged in accordance with at least some embodiments described herein.

As shown in diagram 600, the y-axis may represent an electron concentration 672 ($cm^{-3}$) and the x-axis may represent an emitter current 674 (nA), for example. Electron concentration in the primary channel as a function of emitter current may be a nearly constant (zero slope) curve 678. Electron concentration in the secondary channel as a function of emitter current is curve 676.

The nearly zero slope curve 678 and S-shaped curve 676 may provide further evidence that the onset of significant emitter current and S-shaped NDR characteristic may be achieved due to formation of the secondary channel at the ETL/HTL interface. Formation of the secondary channel may result in two parallel current paths in the ETL region between the emitter terminal and source terminal, creating an increase in the overall conductance of region. In contrast, the conductance in the ETL region between the emitter terminal and the drain terminal may remain substantially the same. This may cause the potential below the emitter terminal to decrease and make the emitter terminal junction more forward biased resulting in a regenerative action. Regenerative action may then give rise to the negative differential resistance (NDR) characteristic in the emitter terminal's current-voltage characteristics, as shown.

Figure 7:
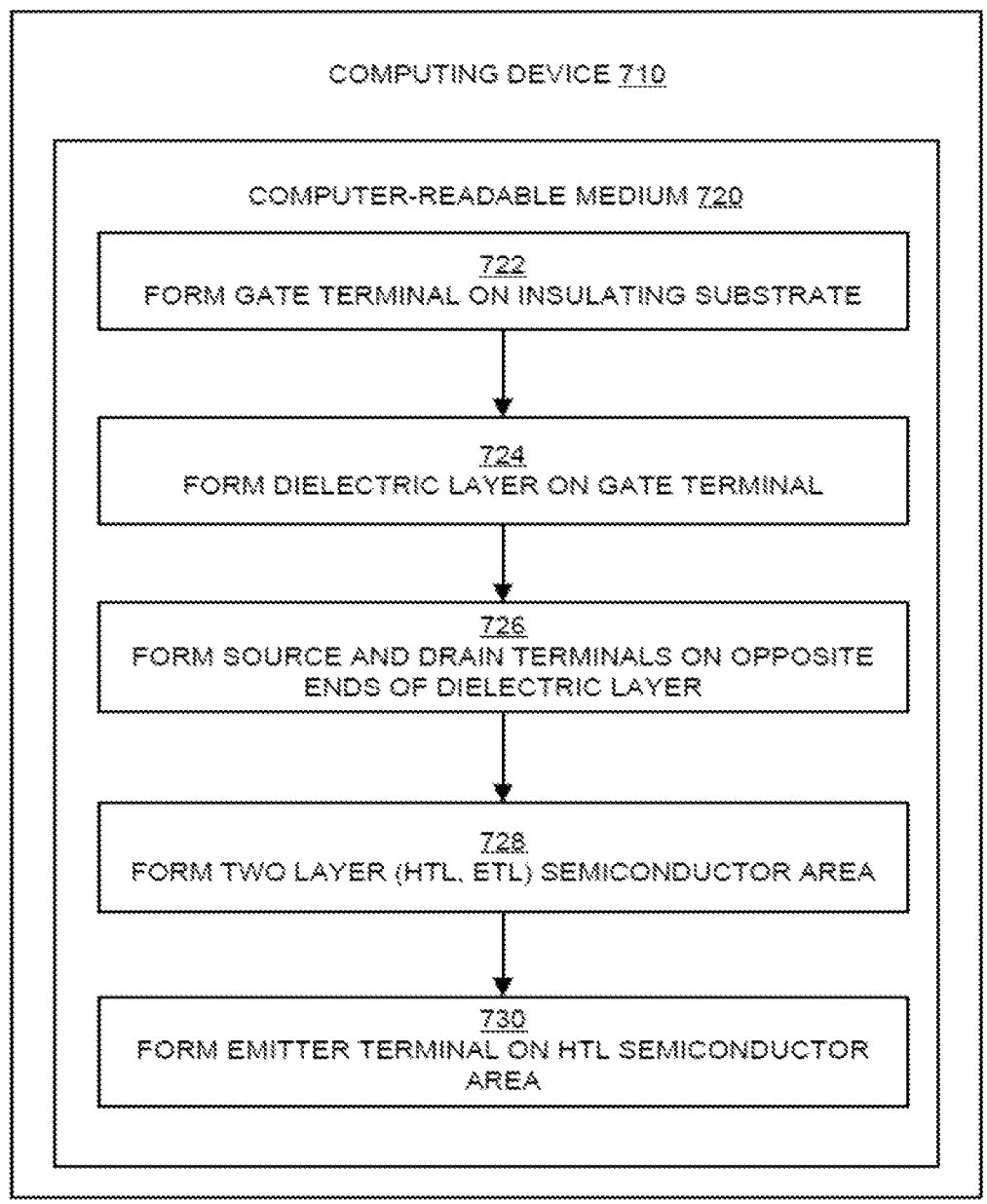
FIG. 7 illustrates a flowchart of an example process to make an example four-terminal thyristor device, all arranged in accordance with at least some embodiments described herein.

FIG. 7 illustrates a flowchart of an example process to make an example four-terminal thyristor device, arranged in accordance with at least some embodiments described herein.

Example methods may include one or more operations, functions or actions as illustrated by one or more of blocks 722, 724, 726, 728 and/or 730. The operations described in the blocks 722-730 may also be stored as computer-executable instructions in a computer-readable medium such as a non-transitory computer-readable medium 720 of a computing device 710. The computing device 710 may include a controller configured to manage a fabrication system for a semiconductor device as described herein. The computer-executable instructions may be executed by the computing device 710 in order to control the fabrication system to perform the operations of FIG. 7.

An example process to fabricate a four-terminal, organic, thin-film semiconductor device may begin with block 722, "FORM GATE TERMINAL ON INSULATING SUBSTRATE", where a gate terminal may be formed on a suitable substrate such as glass, plastic, paper, silicon, etc.

Block 722 may be followed by block 724, "FORM DIELECTRIC LAYER ON GATE TERMINAL", where a dielectric layer may be formed on the gate terminal 334.

Block 724 may be followed by block 726, "FORM SOURCE AND DRAIN TERMINALS ON OPPOSITE ENDS OF THE DIELECTRIC LAYER", where the source terminal 334 and the drain terminal 340 may be formed at opposite locations on the dielectric layer. The source terminal 334 and the drain terminal 340 may serve as the main terminals across the semiconductor area.

Block 726 may be followed by block 728, "FORM TWO LAYER (HTL, ETL) SEMICONDUCTOR AREA", where a hole transport layer (HTL) 336 and an electron transport layer (ETL) 338, each ranging from about 10 nm to about 100 nm thick, may be selected and formed into a semiconductor area, the ETL may be formed below the HTL. The nature of the interface between the HTL and ETL may be selected based on a desired current for the semiconductor area.

Block 728 may be followed by block 730, "FORM EMITTER TERMINAL ON HTL SEMICONDUCTOR AREA", where the emitter terminal 332 may be formed in contact with the HTL 336. The work function of the emitter terminal may be selected so that holes, not electrons, are injected into the HTL layer when the emitter terminal 332 is forward biased.

The operations included in the process of FIG. 7 described above are for illustration purposes. Fabrication of a four-terminal thyristor device may be implemented by similar processes with fewer or additional operations. In some examples, the operations may be performed in a different order. In some other examples, various operations may be eliminated. In still other examples, various operations may be divided into additional operations, supplemented with other operations, or combined together into fewer operations. Although illustrated as sequentially ordered operations, in some implementations, the various operations may be performed in a different order, or in some cases various operations may be performed at substantially the same time.

According to some examples, a semiconductor device is described. An example semiconductor device may include a two-layer semiconductor area comprising a hole transport layer (HTL) and an adjoining electron transport layer (ETL), a source terminal configured to contact the HTL and the ETL at respective first end portions, a drain terminal configured to contact the HTL and the ETL at respective second end portions, the second end portions being opposite to the first end portions, and an emitter terminal configured to contact the HTL. The semiconductor device may further include a dielectric layer configured to contact the source terminal, the drain terminal, and the ETL, and a gate terminal configured to contact the dielectric layer, where the semiconductor device is configured to exhibit negative differential resistance (NDR) characteristics.

In other examples, an onset of the NDR characteristics may be operably controlled by a gate voltage applied to the gate terminal and/or a drain voltage applied to the drain terminal. The HTL and the ETL may have a thickness ranging from about 10 nm to about 100 nm. An interface of the HTL and the ETL may be selected such that a flow of holes from the HTL to the ETL and a flow of electrons from the ETL to the HTL are substantially blocked. A work function of the emitter terminal may be selected such that holes and not electrons are injected into the HTL.

In further examples, the source, the drain, and the gate terminals may be configured to form a n-type thin film transistor (TFT) such that in response to application of a positive gate voltage to the gate terminal electrons accumulate in the ETL near a first interface of the ETL and the dielectric layer. The source, the drain, and the gate terminals may be further configured such that in response to application of a positive drain voltage to the drain terminal, a secondary channel is formed, where the secondary channel comprises of electrons in the ETL near a second interface and where a source-emitter conductance between the source terminal and the emitter terminal is higher in the presence of the secondary channel.

In yet other examples, an emitter-drain conductance between the emitter terminal and the drain terminal may be substantially unaffected due to the presence of the secondary channel. The positive drain voltage may be in a range of about 0 volts to about 40 volts. The positive gate voltage may be in a range of about 0 volts to about 40 volts. The semiconductor device may be a four-terminal, organic, thin-film thyristor.

According to other examples, methods to fabricate a semiconductor device are described. An example method may include forming a two-layer semiconductor area comprising a hole transport layer (HTL) and an adjoining electron transport layer (ETL); forming a source terminal to contact the HTL and the ETL at respective first end portions; forming a drain terminal to contact the HTL and the ETL at respective second end portions, the second end portions being opposite to the first end portions; and forming a dielectric layer to contact the source terminal, the drain terminal, and the ETL. The method may further include forming a gate terminal to contact the dielectric layer and forming an emitter terminal to contact the HTL, where the semiconductor device is configured to exhibit negative differential resistance (NDR) characteristics.

In some examples, the method may also include configuring one or more of the gate and the drain terminals to control an onset of the NDR characteristics and/or selecting a thickness of the HTL and the ETL in a thickness range from about 10 nm to about 100 nm. The method may further include selecting an interface of the HTL and the ETL based on a current for the semiconductor device and/or selecting a composition and a thickness of the HTL and the ETL such that holes in the HTL attract electrons in the ETL to an interface between the HTL and the ETL and create a secondary channel, wherein the secondary channel comprises electrons in ETL.

In yet other examples, the method may include selecting a composition and a thickness of the HTL and the ETL such that two current paths are formed in the ETL between the emitter and source terminals, where the two current paths result in an increase of conductance between the emitter and source terminals.

According to further examples, methods to operate a semiconductor device are described. An example method may include applying one or more of a gate voltage and a drain voltage to the semiconductor device. The semiconductor device may include a two-layer semiconductor area comprising a hole transport layer (HTL) and an adjoining electron transport layer (ETL); a source terminal configured to contact the HTL and the ETL at respective first end portions; and a drain terminal configured to contact the HTL and the ETL at respective second end portions, the second end portions being opposite to the first end portions. The semiconductor device may also include an emitter terminal configured to contact the HTL; a dielectric layer configured to contact the source terminal, the drain terminal, and the ETL; and a gate terminal configured to contact a dielectric layer. The example method may also include in response to applying the one or more of the gate voltage and the drain voltage, exhibiting, by the semiconductor device, negative differential resistance (NDR) characteristics.

In some examples, applying one or more of the gate voltage or the drain voltage may include applying a positive drain voltage in a range of about 0 volts to about 40 volts so that the semiconductor device exhibits NDR characteristics. Applying one or more of the gate voltage or the drain voltage may also include applying a positive gate voltage in a range of about 0 volts to about 40 volts so that the semiconductor device exhibits NDR characteristics. Applying the positive gate voltage may include applying the positive gate voltage to the gate terminal to form an accumulation layer of electrons at a first interface of the ETL and the dielectric layer such that the source, drain, and gate terminals form an n-type thin film transistor (TFT). The semiconductor device may be a four-terminal, organic, thin-film thyristor.

According to yet other examples, a thyristor is described. An example thyristor may include a two-layer semiconductor area comprising a hole transport layer (HTL) and an adjacent electron transport layer (ETL); a source terminal coupled to the HTL and the ETL at respective first end portions; a drain terminal coupled to the HTL and the ETL at respective second end portions, the second end portions being opposite to the first end portions; an emitter terminal coupled to the HTL; a dielectric layer coupled to the source terminal, the drain terminal, and the ETL; and a gate terminal coupled to a dielectric layer, where the thyristor is configured to exhibit negative differential resistance (NDR) characteristics controlled by one or more of the gate and the drain terminals.

In further examples, an onset of the NDR characteristics may be controlled by selecting one or more of a gate voltage and a drain voltage. The source, drain, and gate terminals may be configured to form an n-type thin film (TFT) transistor such that in response to application of a positive voltage to the gate terminal an accumulation layer of electrons forms at a first interface of the ETL and the dielectric layer.

In other examples, the HTL and the ETL may be configured such that holes in the HTL attract electrons in the ETL to a second interface between the HTL and the ETL and create a secondary channel comprising electrons in ETL in response to the emitter terminal being forward biased. The HTL and the ETL may also be configured such that two current paths are formed in the ETL between the emitter and the source terminals resulting in an increase of conductance between the emitter and the source terminals in response to the emitter terminal being forward biased.

The use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example, as one or more programs running on one or more microprocessors), as firmware, or as virtually any combination thereof, and that designing the circuitry and/or writing the code for the software and or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, a solid state drive, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors.

A typical system may be implemented utilizing any suitable commercially available components, such as those typically found in systems for fabricating a four terminal, organic, thin-film organic thyristor. The herein described subject matter sometimes illustrates different components contained within, or coupled with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the an will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A semiconductor device, comprising:
   a two-layer semiconductor area that comprises a hole transport layer (HTL) and an adjoining electron transport layer (ETL);
   a source terminal configured to contact the HTL and the ETL at respective first end portions;
   a drain terminal configured to contact the HTL and the ETL at respective second end portions, wherein the second end portions are opposite to the first end portions;
   an emitter terminal configured to contact the HTL;
   a dielectric layer configured to contact the source terminal, the drain terminal, and the ETL; and
   a gate terminal configured to contact the dielectric layer, wherein the semiconductor device is configured to exhibit negative differential resistance (NDR) characteristics.

2. The semiconductor device of claim 1, wherein the gate terminal is configured to be applied with a gate voltage, wherein the drain terminal is configured to be applied with a drain voltage, and wherein at least one of the gate voltage and the drain voltage controls an onset of the NDR characteristics.

3. The semiconductor device of claim 1, wherein the HTL and the ETL have a thickness in a range from about 10 nm to about 100 nm.

4. The semiconductor device of claim 1, further comprising an interface between the HTL and the ETL, wherein the interface is configured to block a flow of holes from the HTL to the ETL and block a flow of electrons from the ETL to the HTL.

5. The semiconductor device of claim 1, wherein the emitter terminal is configured to inject holes and not electrons into the HTL based on a work function of the emitter terminal.

6. The semiconductor device of claim 1, wherein the source terminal, the drain terminal, and the gate terminal are configured to form an n-type thin film transistor (TFT) such that in response to application of a positive gate voltage to the gate terminal, electrons accumulate in the ETL near a first interface of the ETL and the dielectric layer.

7. The semiconductor device of claim 6, wherein the source terminal, the drain terminal, and the gate terminal are further configured to form a secondary channel after the drain terminal is applied with a positive drain voltage, wherein the secondary channel comprises electrons in the ETL near a second interface, and wherein a source-emitter conductance, between the source terminal and the emitter terminal, is higher in presence of the secondary channel.

8. The semiconductor device of claim 7, wherein an emitter-drain conductance in a region, between the emitter terminal and the drain terminal, remains same due to the presence of the secondary channel.

9. The semiconductor device of claim 7, wherein the drain terminal is configured to be applied with the positive drain voltage in a range from about 0 volts to about 40 volts.

10. The semiconductor device of claim 7, wherein the gate terminal is configured to be applied with the positive gate voltage in a range from about 0 volts to about 40 volts.

11. The semiconductor device of claim 1, wherein the semiconductor device includes a four-terminal, organic, thin-film thyristor.

12. A method to fabricate a semiconductor device, the method comprising:
   forming a two-layer semiconductor area that comprises a hole transport layer (HTL) and an adjoining electron transport layer (ETL);
   forming a source terminal to contact the HTL and the ETL at respective first end portions;
   forming a drain terminal to contact the HTL and the ETL at respective second end portions, wherein the second end portions are opposite to the first end portions;
   forming a dielectric layer to contact the source terminal, the drain terminal, and the ETL;
   forming a gate terminal to contact the dielectric layer; and
   forming an emitter terminal to contact the HTL, wherein the semiconductor device is configured to exhibit negative differential resistance (NDR) characteristics.

13. The method of claim 12, further comprising configuring one or more of the gate terminal and the drain terminal to control an onset of the NDR characteristics.

14. The method of claim 12, further comprising selecting a thickness of the HTL and the ETL in a thickness range from about 10 nm to about 100 nm.

15. The method of claim 12, further comprising selecting an interface of the HTL and the ETL based on a current for the semiconductor device.

16. The method of claim 12, further comprising selecting a composition and a thickness of the HTL and the ETL such that holes in the HTL attract electrons in the ETL to an interface between the HTL and the ETL and create a secondary channel, wherein the secondary channel comprises electrons in the ETL.

17. The method of claim 12, further comprising selecting a composition and a thickness of the HTL and the ETL such that two current paths are formed in the ETL between the emitter terminal and the source terminal, wherein the two current paths result in an increase of conductance between the emitter terminal and the source terminal.

18. A method to operate a semiconductor device, the method comprising:
   applying a gate voltage to the semiconductor device; and
   applying a drain voltage to the semiconductor device, wherein the semiconductor device includes:
      a two-layer semiconductor area that comprises a hole transport layer (HTL) and an adjoining electron transport layer (ETL);
      a source terminal configured to contact the HTL and the ETL at respective first end portions;
      a drain terminal configured to contact the HTL and the ETL at respective second end portions, wherein the second end portions being are opposite to the first end portions;
      an emitter terminal configured to contact the HTL;
      a dielectric layer configured to contact the source terminal, the drain terminal, and the ETL; and
      a gate terminal configured to contact the dielectric layer,
   wherein in response to the application of the gate voltage and the drain voltage, the semiconductor device exhibits negative differential resistance (NDR) characteristics.

19. The method of claim 18, wherein applying the drain voltage includes applying a positive drain voltage in a range from about 0 volts to about 40 volts so that the semiconductor device exhibits the NDR characteristics.

20. The method of claim 18, wherein applying the gate voltage includes applying a positive gate voltage in a range from about 0 volts to about 40 volts so that the semiconductor device exhibits the NDR characteristics.

21. The method of claim 20, wherein applying the positive gate voltage includes applying the positive gate voltage to the gate terminal to form an accumulation layer of electrons at a first interface of the ETL and the dielectric layer such that the source terminal, the drain terminal, and the gate terminal form an n-type thin film transistor (TFT).

22. The method of claim 18, wherein the semiconductor device includes a four-terminal, organic, thin-film thyristor.

23. A thyristor, comprising:
   a two-layer semiconductor area that comprises a hole transport layer (HTL) and an adjacent electron transport layer (ETL);
   a source terminal coupled to the HTL and the ETL;
   a drain terminal coupled to the HTL and the ETL;
   an emitter terminal coupled to the HTL;
   a dielectric layer coupled to the source terminal, the drain terminal, and the ETL; and
   a gate terminal coupled to the dielectric layer, wherein the thyristor is configured to exhibit negative differential resistance (NDR) characteristics controllable by one or more of the gate terminal and the drain terminal.

24. The thyristor of claim 23, wherein the gate terminal is configured to be applied with a gate voltage, wherein the drain terminal is configured to be applied with a drain voltage, and wherein at least one of the gate voltage and the drain voltage controls an onset of the NDR characteristics.

25. The thyristor of claim 23, wherein the source terminal, the drain terminal, and the gate terminal are configured to form an n-type thin film transistor (TFT) such that in response to application of a positive voltage to the gate terminal, an accumulation layer of electrons is formed at a first interface of the ETL and the dielectric layer.

26. The thyristor of claim 23, wherein the HTL and the ETL are configured such that holes in the HTL attract electrons in the ETL to a second interface between the HTL and the ETL and create a secondary channel that comprises electrons in the ETL in response to the emitter terminal being forward biased.

27. The thyristor of claim 23, wherein the HTL and the ETL are configured such that two current paths are formed in the ETL between the emitter terminal and the source terminal that results in an increase of conductance between the emitter terminal and the source terminal in response to the emitter terminal being forward biased.

* * * * *

UNITED STATES PATENT AND TRADEMARK OFFICE
CERTIFICATE OF CORRECTION

PATENT NO. : 9,831,453 B2
APPLICATION NO. : 15/026705
DATED : November 28, 2017
INVENTOR(S) : Mazhari et al.

It is certified that error appears in the above-identified patent and that said Letters Patent is hereby corrected as shown below:

In the Specification

In Column 13, Line 37, delete "an" and insert -- art --, therefor.

In the Claims

In Column 15, Line 61, in Claim 18, delete "portions being are" and insert -- portions are --, therefor.

Signed and Sealed this
Seventeenth Day of April, 2018

Andrei Iancu
*Director of the United States Patent and Trademark Office*